(12) United States Patent
Liu et al.

(10) Patent No.: US 10,615,365 B2
(45) Date of Patent: Apr. 7, 2020

(54) PACKAGE ASSEMBLIES AND THE PACKAGING METHOD THEREOF

(71) Applicant: Shenzhen China Star Optoelectronics Technology Co., Ltd., Shenzhen, Guangdong (CN)

(72) Inventors: Yawei Liu, Guangdong (CN); Boyan Lv, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 780 days.

(21) Appl. No.: 15/025,253

(22) PCT Filed: Feb. 26, 2016

(86) PCT No.: PCT/CN2016/074641
§ 371 (c)(1),
(2) Date: Mar. 25, 2016

(87) PCT Pub. No.: WO2017/128475
PCT Pub. Date: Aug. 3, 2017

(65) Prior Publication Data
US 2018/0205034 A1    Jul. 19, 2018

(30) Foreign Application Priority Data

Jan. 29, 2016  (CN) .......................... 2016 1 0064236

(51) Int. Cl.
*H01L 51/00*    (2006.01)
*H01L 51/52*    (2006.01)
(Continued)

(52) U.S. Cl.
CPC ............ *H01L 51/5246* (2013.01); *C03C 8/24* (2013.01); *C03C 27/06* (2013.01);
(Continued)

(58) Field of Classification Search
CPC ......... H01L 51/00; H01L 51/50; H01L 51/52; H01L 51/52; H01L 51/524; H01L 51/524;
(Continued)

(56) References Cited

U.S. PATENT DOCUMENTS

2013/0134396 A1* 5/2013 Shimomura ........ H01L 51/5012
257/40
2015/0194627 A1* 7/2015 Liu ........................ H05B 33/10
428/76
(Continued)

FOREIGN PATENT DOCUMENTS

CN    101807672 A    8/2010
CN    103337511 A    10/2013
(Continued)

*Primary Examiner* — Jacob T Minskey
*Assistant Examiner* — Matthew Hoover
(74) *Attorney, Agent, or Firm* — Andrew C. Cheng

(57) ABSTRACT

The present disclosure relates to a packaging assembly and a glass packing method. The method includes the following steps: coating ring-shaped glass adhesive on the glass cover; coating outer frame glue of ring-shaped at an outer side of the glass adhesive, wherein the outer frame glue is spaced apart from the glass adhesive; coating inner frame glue at an inner side of the glass adhesive; filling packing material to an inner side of the inner frame glue; bonding the glass substrate on the glass cover; and radiating the glass adhesive by laser to weld the glass substrate on the glass cover by the glass adhesive. The method prevents the oxygen and the moisture from entering the glass adhesive so as to extend the life cycle of the components within the glass adhesive.

16 Claims, 3 Drawing Sheets

(51) Int. Cl.
　　　*C03C 27/06*　　　(2006.01)
　　　*C03C 8/24*　　　(2006.01)
　　　*H01L 51/56*　　　(2006.01)
　　　*C03C 27/10*　　　(2006.01)

(52) U.S. Cl.
　　　CPC .......... *H01L 51/5253* (2013.01); *H01L 51/56* (2013.01); *C03C 27/10* (2013.01)

(58) Field of Classification Search
　　　CPC . H01L 51/5246; H01L 51/525; H01L 51/525; H01L 51/5253; H01L 51/56
　　　See application file for complete search history.

(56) References Cited

U.S. PATENT DOCUMENTS

| | | |
|---|---|---|
| 2016/0240597 A1 | 8/2016 | Chen et al. |
| 2016/0293886 A1 | 10/2016 | Yu |
| 2016/0343977 A1* | 11/2016 | Zeng .................. H01L 51/56 |
| 2016/0380228 A1* | 12/2016 | Yang ................ H01L 51/5246 |
| | | 257/40 |

FOREIGN PATENT DOCUMENTS

| | | | |
|---|---|---|---|
| CN | 103730071 A | 4/2014 | |
| CN | 104218176 A | 12/2014 | |
| CN | 105702882 A | 6/2016 | |
| WO | WO-0132349 A1 * | 5/2001 | .......... C03B 33/091 |

* cited by examiner

PACKAGE ASSEMBLIES AND THE PACKAGING METHOD THEREOF

BACKGROUND OF THE INVENTION

1. Field of the Invention

The present disclosure relates to packaging technology, and more particularly to a packaging method and the package assembly encapsulated by the packaging method.

2. Discussion of the Related Art

Conventionally, LCDs/OLEDs are encapsulated by adopting UV glue, which is characterized by attributes such as, only a small amount or even no solvent is involved, which reduces the pollution subject to the environment. In addition, the attributes also include: low power consumption, may be cured at a low temperature, suitable for heat-sensitive materials, fast curing speed, high efficiency, may be suitable for high-speed production, and the curing device only occupies a small dimension. However, as the UV glue is organic material, and a larger gap is between the molecules after being cured. For this reason, moisture and oxygen may arrive an internal sealed area via medium, and thus is suitable for fields that is not sensitive to the moisture and the oxygen. In other words, the packing method adopting the UV rays may result in that the moisture and the oxygen penetrate into the internal area of the OLED so as to affect the display performance of the OLED.

A newly developed packing method adopts glass adhesive. By configuring the solvent having glass power, and the solvent with certain viscosity is coated on the glass substrate. The solvent is then removed by a heating process so as to be bonded with the glass substrate. By adopting the laser to melt the glass power such that two glasses are bonded together. The glass adhesive packing method may prevent the moisture and the oxygen from penetration, and thus may be applicable to the OLED technology sensitive to the moisture and the oxygen.

SUMMARY

The present disclosure relates to a packaging assembly and a glass packing method to overcome the above problems.

In one aspect, a glass packing method includes: providing a glass cover and a glass substrate; coating ring-shaped glass adhesive on the glass cover; coating outer frame glue of ring-shaped at an outer side of the glass adhesive, wherein the outer frame glue is spaced apart from the glass adhesive; coating inner frame glue at an inner side of the glass adhesive; filling packing material to an inner side of the inner frame glue; filling nitrogen into a chamber of an assembly machine; arranging the glass substrate and the glass cover within the chamber to closely adhere the glass substrate on the glass cover, and filling the nitrogen into an inner side of the outer frame glue; and radiating the glass adhesive by laser to weld the glass substrate on the glass cover by the glass adhesive.

Wherein the step of radiating the glass adhesive by the laser includes: adjusting radiation parameters of the laser to configure a dimension of a focal spot of the laser to be compatible with the glass adhesive; and moving the focal spot on the glass adhesive to weld the glass substrate on the glass cover.

Wherein the step of moving the focal spot on the glass adhesive to weld the glass substrate on the glass cover further includes: removing the glass substrate and the glass cover corresponding to the outer side of the glass adhesive; and grinding edges of the glass substrate and the glass cover after the glass substrate and the glass cover are removed.

Wherein before the step of radiating the glass adhesive by the laser, the method further includes: radiating the outer frame glue via ultraviolet rays to cure the outer frame glue.

Wherein the step of radiating the glass adhesive by laser further includes: radiating the glass adhesive by laser beams emitted from a carbon dioxide laser.

In another aspect, a glass packing method includes: providing a glass cover and a glass substrate; coating ring-shaped glass adhesive on the glass cover; coating outer frame glue of ring-shaped at an outer side of the glass adhesive, wherein the outer frame glue is spaced apart from the glass adhesive; filling packing material to an inner side of the inner frame glue; adhering the glass substrate on the glass cover; and radiating the glass adhesive by laser to weld the glass substrate on the glass cover by the glass adhesive.

Wherein after the step of coating outer frame glue of ring-shaped at an outer side of the glass adhesive, the method further includes: coating inner frame glue at an inner side of the glass adhesive.

Wherein the step of radiating the glass adhesive by the laser further includes: adjusting radiation parameters of the laser to configure a dimension of a focal spot of the laser to be compatible with the glass adhesive; and moving the focal spot on the glass adhesive to weld the glass substrate on the glass cover.

Wherein the step of adhering the glass substrate on the glass cover further includes: filling nitrogen into a chamber of an assembly machine; and arranging the glass substrate and the glass cover within the chamber to closely adhere the glass substrate on the glass cover, and filling the nitrogen into an inner side of the outer frame glue.

Wherein, after the step of moving the focal spot on the glass adhesive to weld the glass substrate on the glass cover, the method further includes: removing the glass substrate and the glass cover corresponding to the outer side of the glass adhesive; and grinding edges of the glass substrate and the glass cover after the glass substrate and the glass cover are removed.

Wherein before the step of radiating the glass adhesive by the laser, the method further includes: radiating the outer frame glue via ultraviolet rays to cure the outer frame glue.

Wherein, after the step of coating ring-shaped glass adhesive on the glass cover, the method further includes: baking the glass adhesive.

In another aspect, a packaging assembly includes: a glass cover; a glass substrate bonding on the glass cover; packing material being arranged between the glass substrate and the glass cover; and glass adhesive arranged at an outer side of the packing material, wherein the glass cover is welded on the glass substrate via the glass adhesive.

Wherein the packaging assembly further includes inner frame glue being arranged between the glass adhesive and the packing material.

Wherein a first gap is formed between the glass adhesive and the inner frame glue, and the gap is not smaller than 100 microns.

Wherein chemical ingredient of the packing material is [R—O—Al=O]n, wherein R is $C_nH_{2n+1}CO$.

Wherein the glass adhesive includes glass powder, inorganic packing material, and organic solvent, and wherein the inorganic packing material is $V_2O_5$.

Wherein the glass substrate, the glass cover, and the glass adhesive cooperatively define a closed space filled with nitrogen.

Wherein the inner frame glue is ultraviolet glue.

Wherein a width of the cross-section of the inner frame glue is in a range between 0.2 and 5 millimeters.

In view of the above, the glass adhesive 40 is coated on the glass cover 20, and the outer frame glue is coated on the outer side of the glass adhesive 40, wherein the coating is between the outer frame glue and the glass adhesive 40. The packing material 30 fills up the inner side of the glass adhesive 40. The glass substrate 10 adheres to the glass cover 20. The laser is adopted to radiate the glass adhesive 40 such that the glass adhesive 40 welds the glass substrate 10 on the glass cover 20. In this way, by laser welding the glass adhesive 40, a sealed space is formed within the glass adhesive 40 to avoid the oxygen or the moisture from penetrated. This extends the life cycle of the components within the glass adhesive 40 and on the glass substrate 10. By adopting the packing material 30, the mechanical strength of the packaging assembly is enhanced.

DETAILED DESCRIPTION OF THE EMBODIMENTS

Embodiments of the invention will now be described more fully hereinafter with reference to the accompanying drawings, in which embodiments of the invention are shown.

Figure 1:
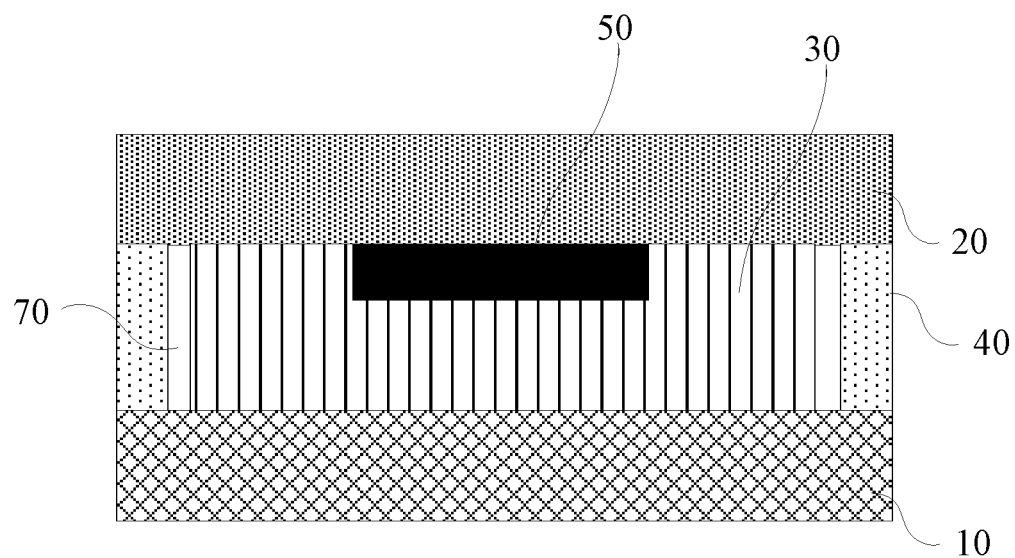
FIG. 1 is a cross-sectional view of the packaging assembly in accordance with one embodiment.

FIG. 1 is a cross-sectional view of the packaging assembly in accordance with one embodiment. The packaging assembly includes a glass substrate 10, a glass cover 20, packing material 30, glass adhesive 40, and an OLED 50. The glass substrate 10 and the glass cover 20 are made by glasses. The glass substrate 10 adheres to the glass cover 20. The packing material 30 is arranged between the glass substrate 10 and the glass cover 20. The OLED 50 is arranged within the packing material 30, and is fixed on the glass substrate 10. Alternatively, the OLED 50 is embedded within the packing material 30, or a portion of the OLED 50 is exposed from the packing material 30. In another example, the OLED 50 aligns with an outer surface of the packing material 30. The glass adhesive 40 is arranged at a lateral side of the packing material 30, wherein the glass cover 20 is welded on the glass substrate 10 via the glass adhesive 40.

Specifically, the glass adhesive 40 forms a rim surrounding the glass substrate 10, and the packing material 30 is filled within the rim of the glass substrate 10. In another example, the packing material 30 may fill the rim, or may be spaced apart from the glass substrate 10. It is to be noted that the gas within the closed space cooperatively defined by the glass substrate 10, the glass cover 20, and the glass adhesive 40 is nitrogen, which avoids the external air form entering the internal of the rim. The closed space is formed by welding the glass adhesive 40 between the glass substrate 10 and the glass cover 20 via carbon dioxide laser or other lasers.

The packing material 30 is liquid desiccant materials, and the ingredient includes [R—O—Al═O]n, which may absorb the water penetrating through the glass adhesive 40. The R within the [R—O—Al═O]n may be $C_nH_{2n+1}CO$, and the chemical formula expressing the interaction between [R—O—Al═O]n and water is shown below:

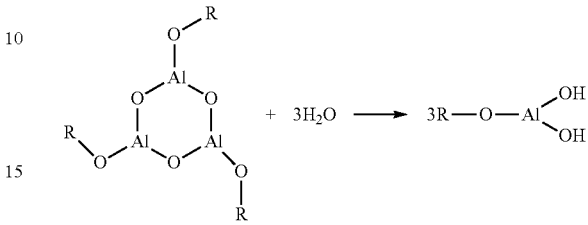

Figure 2:
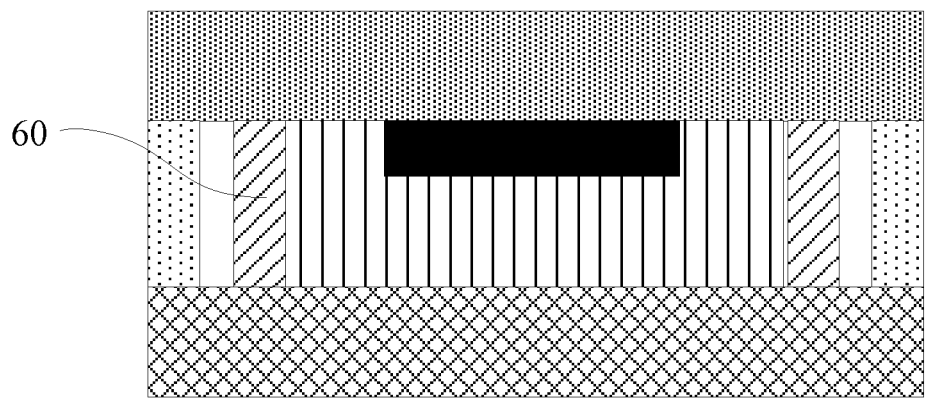
FIG. 2 is a schematic view of the packaging assembly in accordance with another embodiment.

FIG. 2 is a schematic view of the packaging assembly in accordance with another embodiment. The difference between this embodiment and the previous embodiment resides in that: the packaging assembly also includes inner frame glue 60 arranged between the glass adhesive 40 and the packing material 30. Specifically, the inner frame glue 60 forms an inner ring on the surface of the glass substrate glass substrate 10, and the packing material 30 is filled within the inner frame glue 60. The inner frame glue 60 may further prevent the oxygen or moisture from penetrating into the packing material 30.

Further, a first gap 70 is formed between the glass adhesive 40 and the inner frame glue 60, and the gap is not smaller than 100 microns. As shown in FIG. 2, the width of the cross-section of the inner frame glue 60 is in a range between 0.2 and 5 millimeters.

Figure 2A:
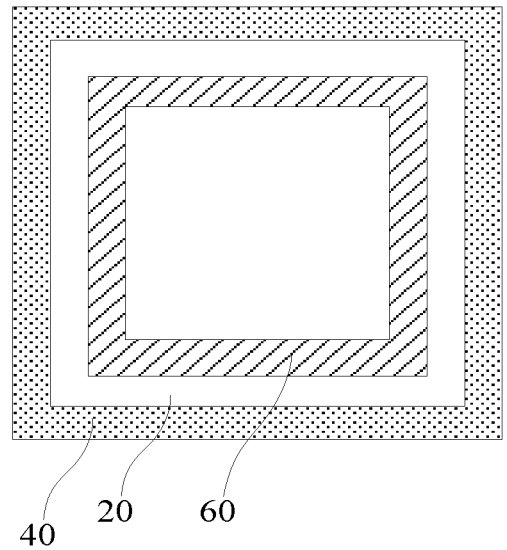
FIG. 2a is a top view of the glass adhesive and the inner frame glue of the packaging assembly of FIG. 2.

FIG. 2a is a top view of the glass adhesive and the inner frame glue of the packaging assembly of FIG. 2. The glass adhesive 40 and the inner frame glue 60 respectively forms an outer ring and an inner ring. The shape of the outer ring and the inner ring may be square, circular, or other shapes. The shapes of the glass adhesive 40 and the inner frame glue 60 may be different. In an example, the glass adhesive 40 is square-shaped, and the inner frame glue 60 is circular-shaped. The inner frame glue 60 may be ultraviolet glue, optical transparent glue or other adhesive. Preferably, the inner frame glue 60 may be the ultraviolet glue.

The present disclosure also relates to a display device having the above packing assembly.

Figure 3:
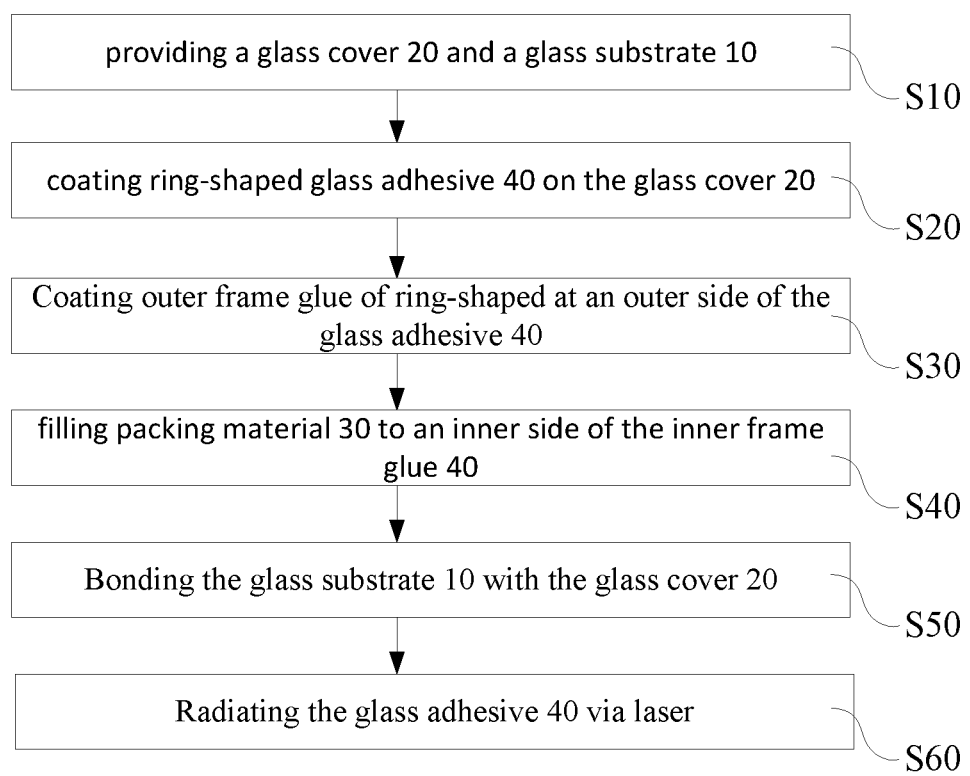
FIG. 3 is a flowchart of the glass packing method in accordance with one embodiment.

FIG. 3 is a flowchart of the glass packing method in accordance with one embodiment. The components of the packaging assembly have been briefly described, the glass packing method includes the following steps:

In step S10, providing a glass cover 20 and a glass substrate 10.

Specifically, the glass substrate 10 includes a plurality of components on the surface, and the components include, at least, the OLED 50.

In step S20, coating a ring-shaped glass adhesive 40 on the glass cover 20.

Specifically, the glass adhesive 40 is made by glass powder, inorganic packing material, and organic solvent. The inorganic packing material is configured for absorbing the energy of laser power, which may be $V_2O_5$. The glass adhesive 40 is an outer ring formed on the surface of the glass cover 20, and the OLED 50 is arranged within the outer ring.

In step S30, the glass adhesive 40 is coated outer frame glue, wherein the coating is between the outer frame glue and the glass adhesive 40.

Specifically, the glass adhesive 40 is formed within the outer frame glue, and the outer frame blue is spaced apart from the glass adhesive 40 by a certain distance, which is a second gap. The second gap is configured such that the outer frame glue outside the second gap may be removed to enhance the cutting precision. The outer frame adhesive may be ultraviolet glue, optical transparent glue or other adhesive. Preferably, the outer frame adhesive may be the ultraviolet glue.

In step S40, the packing material 30 is filling into an inner side of the glass adhesive 40.

Specifically, the packing material 30 is injected into the glass adhesive 40 by ink-jet printing. The packing material 30 may fill up the inner side of the glass adhesive 40. Alternatively, the packing material 30 may be filled within the glass adhesive 40, but the packing material 30 is spaced apart from an inner edge of the glass adhesive 40 by a certain distance. The strength of the packaging assembly may be enhanced by adopting the packing material 30.

In step S50, the glass substrate 10 adheres to the glass cover 20.

Specifically, the glass cover 20 and the glass substrate 10 are bonded together by an assembly machine.

In step S60, the laser is adopted to radiate the glass adhesive 40 so as to weld the glass substrate 10 to the glass cover 20.

Specifically, the carbon dioxide laser or other laser may be adopted to weld the glass adhesive 40 between the glass substrate 10 and the glass cover 20 such that the glass substrate 10, the glass cover 20, and the glass adhesive 40 cooperatively define a closed space.

Figure 4:
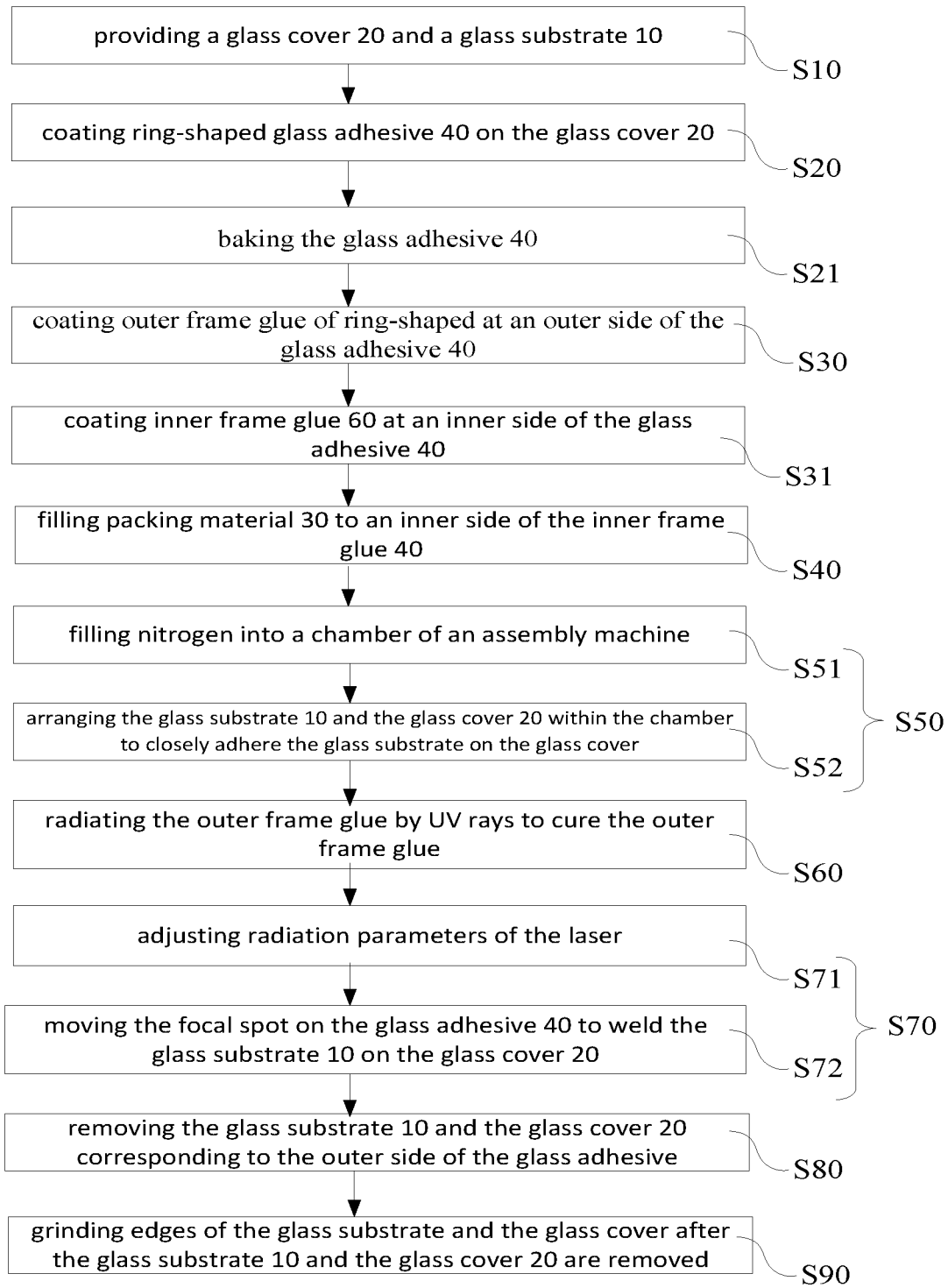
FIG. 4 is a flowchart of the glass packing method in accordance with another embodiment.

FIG. 4 is a flowchart of the glass packing method in accordance with another embodiment. This embodiment is similar to the above embodiment, and the glass packing method includes the following steps:

In step S10, providing a glass cover 20 and a glass substrate 10.

Specifically, the glass substrate 10 includes a plurality of components on the surface, and the components include, at least, the OLED 50.

In step S20, coating a ring-shaped glass adhesive 40 on the glass cover 20.

Specifically, the glass adhesive 40 is made by glass powder, inorganic packing material, and organic solvent. The inorganic packing material is configured for absorbing the energy of laser power, which may be $V_2O_5$. The glass adhesive 40 is an outer ring formed on the surface of the glass cover 20, and the OLED 50 is arranged within the outer ring.

In step S21, a baking process is applied to the glass adhesive 40.

The glass cover 20 coated with the glass adhesive 40 is arranged within an oven until the glass adhesive 40 is completely dry, wherein the temperature of the oven is in a range between 300 and 500 degrees.

In step S30, the outer side of the glass adhesive 40 is coated with the outer frame glue, and the coating is between the outer frame glue and the glass adhesive 40.

Specifically, the glass adhesive 40 is formed within the outer frame glue, and the outer frame blue is spaced apart from the glass adhesive 40 by a certain distance, which is a second gap. The second gap is configured such that the outer frame glue outside the second gap may be removed to enhance the cutting precision. The outer frame adhesive may be ultraviolet glue, optical transparent glue or other adhesive. Preferably, the outer frame adhesive may be the ultraviolet glue.

In step S31, the inner side of the glass adhesive 40 is coated with the inner frame glue 60.

Specifically, the inner frame glue 60 forms an inner ring on the glass cover 20, and the coating is arranged between the inner ring and the glass adhesive 40, wherein the first gap 70 between the glass adhesive 40 and the inner frame glue 60 is not smaller than 100 microns. As shown in FIG. 2, the width of the cross-section of the inner frame glue 60 is in a range between 0.2 and 5 millimeters. The inner frame glue 60 may be ultraviolet glue, optical transparent glue or other adhesive. Preferably, the inner frame glue 60 may be the ultraviolet glue.

In step S40, the packing material 30 is filling into an inner side of the glass adhesive 40.

Specifically, the packing material 30 is injected into the glass adhesive 40 by ink-jet printing. The packing material 30 may fill up the inner side of the glass adhesive 40. Alternatively, the packing material 30 may be filled within the glass adhesive 40, but the packing material 30 is spaced apart from an inner edge of the glass adhesive 40 by a certain distance. The strength of the packaging assembly may be enhanced by adopting the packing material 30.

In step S50, the glass substrate 10 adheres to the glass cover 20.

Specifically, the step S50 includes the following steps:

In step S51, a chamber of the assembly machine is filled with nitrogen.

In step S52, the glass substrate 10 and the glass cover 20 are arranged within the chamber to adhere the glass substrate 10 on the glass cover 20, and the space within the outer frame glue is filled with the nitrogen.

Specifically, the parameters of the assembly machine have to be adjusted. For instance, the vacuum degree of the assembly machine may be adjusted from 20000 pa to be in a range between 1 and 10 pa. In addition, the pressure of the assembly machine is increased, such as from 1 kN to be in a range between 2 kN and 10 kN. In an example, the above two parameters are configured at the same time. Under the vacuum condition, the glass cover 20 and the glass substrate 10 are arranged within the chamber of the assembly machine in turn so as to bond the two glasses together in correct location. The second space between the outmost outer frame glue and the glass adhesive 40 forms a nitrogen sealed loop. Similarly, the space within the glass adhesive 40 is filled with the nitrogen to prevent the air from entering, which avoids the oxygen within the air to chemically react with the components, such as the OLED 50, so as to enhance the life cycle of the packaging assembly.

In step S60, adopting ultraviolet rays to radiate the outer frame glue to cure the outer frame glue.

Specifically, when the outer frame glue and the inner frame glue 60 are ultraviolet glue, the ultraviolet curing has to be applied. The ultraviolet rays are invisible, and are electro-magnetic radiation having the wavelength in a range between 10 and 400 nm. In the embodiment, the ultraviolet glue has to be cured by ultraviolet radiation, which may be an adhesive agent, or glue such as paint, coating, and ink. In the embodiment, the photosensitizer within the ultraviolet curing material absorbs the ultraviolet rays so as to generate active radical and positive ions, which results in chemical reactions, such as polymerization, cross-linking, and grafting. As such, the adhesive transits from a liquid state to a solid state within a few seconds. In the end, the outer frame glue and the inner frame glue 60 help the glass cover 20 to be stably adhered to the glass substrate 10.

In step S70, the laser is adopted to radiate the glass adhesive 40 so as to weld the glass substrate 10 to the glass cover 20.

Specifically, in step S71, the parameters of the laser may be adjusted such that the focal spot of the laser is compatible with the glass adhesive 40.

Specifically, the carbon dioxide laser or other laser may be adopted such that the focal length of the emitted laser, the dimension of the focal spot, and the strength of the laser energy may be adjusted such that the focal spot may precisely fall on the glass adhesive 40. Moving the focal spots of the laser along the glass adhesive 40, the glass adhesive 40 may be welded together with the glass cover 20 and the glass substrate 10.

In step S72, moving the focal spots on the glass adhesive 40 to weld the glass substrate 10 on the glass cover 20.

In step S80, the glass substrate 10 and the glass cover 20 corresponding to the outer frame glue are removed.

Specifically, the second gap is formed between the outer frame glue and the glass. The second gap may be taken as a boundary to cut the glass substrate 10 and the glass cover 20 along a vertical-upward direction. In this way, the outer frame glue is removed so as to form the packaging assembly.

In step S90, after being cut, the edges of the glass substrate 10 and the glass cover 20 are ground.

Specifically, as the edges of the glass substrate 10 and the glass cover 20 may be sharp after the cutting process, and thus the edges have to be ground to enhance the quality and the safety.

In view of the above, the glass adhesive 40 is coated on the glass cover 20, and the outer frame glue is coated on the outer side of the glass adhesive 40, wherein the coating is between the outer frame glue and the glass adhesive 40. The packing material 30 fills up the inner side of the glass adhesive 40. The glass substrate 10 adheres to the glass cover 20. The laser is adopted to radiate the glass adhesive 40 such that the glass adhesive 40 welds the glass substrate 10 on the glass cover 20. In this way, by laser welding the glass adhesive 40, a sealed space is formed within the glass adhesive 40 to avoid the oxygen or the moisture from penetrated. This extends the life cycle of the components within the glass adhesive 40 and on the glass substrate 10. By adopting the packing material 30, the mechanical strength of the packaging assembly is enhanced.

It should be noted that, in the present disclose, the terms "first", "second", "up", "down", "left", and "right" and other terms are only text symbols, and are not limited to, and the text symbols can be used interchangeably.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A glass packing method, comprising:
   providing a glass cover, and a glass substrate;
   coating a glass adhesive on the glass cover and arranging the glass adhesive to form a ring shape;
   coating an outer frame glue on the glass cover and at an outer side of the glass adhesive, and arranging the outer frame glue to form a ring shape, wherein the outer frame glue is spaced apart from the glass adhesive;
   coating an inner frame glue on the glass cover and at an inner side of the glass adhesive, and arranging the outer frame glue to form a ring shape;
   filling a packing material to an inner side of the inner frame glue, wherein a part of a top surface of the packing material, a top surface of the glass adhesive, and a top surface of the inner frame glue are coplanar, and another part of the top surface of the packing material is lower than the top surface of the glass adhesive and the top surface of the inner frame glue;
   filling nitrogen into a chamber of an assembly machine;
   arranging the glass substrate and the glass cover within the chamber to closely adhere the glass substrate on the glass cover, and filling the nitrogen into an inner side of the outer frame glue; and
   radiating the glass adhesive by laser to weld the glass substrate on the glass cover by the glass adhesive.

2. The glass packing method as claimed in claim 1, wherein the step of radiating the glass adhesive by the laser comprises:
   adjusting radiation parameters of the laser to configure a dimension of a focal spot of the laser to be compatible with the glass adhesive; and
   moving the focal spot on the glass adhesive to weld the glass substrate on the glass cover.

3. The glass packing method as claimed in claim 2, wherein the step of moving the focal spot on the glass adhesive to weld the glass substrate on the glass cover further comprises:
   removing the glass substrate and the glass cover corresponding to the outer side of the glass adhesive; and
   grinding edges of the glass substrate and the glass cover after the glass substrate and the glass cover are removed.

4. The glass packing method as claimed in claim 1, wherein before the step of radiating the glass adhesive by the laser, the method further comprises:
   radiating the outer frame glue via ultraviolet rays to cure the outer frame glue.

5. The glass packing method as claimed in claim 1, wherein the step of radiating the glass adhesive by laser further comprises:
   radiating the glass adhesive by laser beams emitted from a carbon dioxide laser.

6. A glass packing method, comprising:
   providing a glass cover, and a glass substrate;
   coating a glass adhesive on the glass cover and arranging the glass adhesive to form a ring shape;
   coating an outer frame glue on the glass cover and at an outer side of the glass adhesive, and arranging the outer frame glue to form a ring shape, wherein the outer frame glue is spaced apart from the glass adhesive;
   filling a packing material to an inner side of the glass adhesive, wherein a part of a top surface of the packing material and a top surface of the glass adhesive are coplanar, and another part of the top surface of the packing material is lower than the top surface of the glass adhesive;
   adhering the glass substrate on the glass cover; and
   radiating the glass adhesive by laser to weld the glass substrate on the glass cover by the glass adhesive.

7. The glass packing method as claimed in claim 6, wherein after the step of coating outer frame glue of ring-shaped at an outer side of the glass adhesive, the method further comprises:
   coating an inner frame glue at an inner side of the glass adhesive.

8. The glass packing method as claimed in claim 7, wherein the step of radiating the glass adhesive by the laser further comprises:
  adjusting radiation parameters of the laser to configure a dimension of a focal spot of the laser to be compatible with the glass adhesive; and
  moving the focal spot on the glass adhesive to weld the glass substrate on the glass cover.

9. The glass packing method as claimed in claim 6, wherein the step of adhering the glass substrate on the glass cover further comprises:
  filling nitrogen into a chamber of an assembly machine; and
  arranging the glass substrate and the glass cover within the chamber to closely adhere the glass substrate on the glass cover, and filling the nitrogen into an inner side of the outer frame glue.

10. The glass packing method as claimed in claim 8, wherein, after the step of moving the focal spot on the glass adhesive to weld the glass substrate on the glass cover, the method further comprises:
  removing the glass substrate and the glass cover corresponding to the outer side of the glass adhesive; and
  grinding edges of the glass substrate and the glass cover after the glass substrate and the glass cover are removed.

11. The glass packing method as claimed in claim 6, wherein before the step of radiating the glass adhesive by the laser, the method further comprises:
  radiating the outer frame glue via ultraviolet rays to cure the outer frame glue.

12. The glass packing method as claimed in claim 8, wherein, after the step of coating ring-shaped glass adhesive on the glass cover, the method further comprises:
  baking the glass adhesive.

13. The glass packing method according to claim 1, further comprising:
  providing an organic light emitting diode (OLED) and arranging the OLED within the packing material.

14. The glass packing method according to claim 13, wherein, the OLED is received in the part of the top surface of the packing material being lower than the top surface of the glass adhesive and the top surface of the inner frame glue, a top surface of the OLED is exposed from the packing material and coplanar with the part of the top surface of the packing material being coplanar with the top surface of the glass adhesive and the top surface of the inner frame glue.

15. The glass packing method according to claim 6, further comprising:
  providing an organic light emitting diode (OLED) and arranging the OLED within the packing material.

16. The glass packing method according to claim 15, wherein, the OLED is received in the part of the top surface of the packing material being lower than the top surface of the glass adhesive, a top surface of the OLED is exposed from the packing material and coplanar with the part of the top surface of the packing material being coplanar with the top surface of the glass adhesive.

\* \* \* \* \*